(12) United States Patent
Endo

(10) Patent No.: US 6,788,110 B2
(45) Date of Patent: Sep. 7, 2004

(54) CLOCK SIGNAL FEEDING CIRCUIT

(75) Inventor: Nobuyuki Endo, Kanagawa (JP)

(73) Assignee: Oki Electric Industry Co., Ltd., Tokyo (JP)

(*) Notice: Subject to any disclaimer, the term of this patent is extended or adjusted under 35 U.S.C. 154(b) by 77 days.

(21) Appl. No.: 10/322,722

(22) Filed: Dec. 19, 2002

(65) Prior Publication Data

US 2004/0000931 A1 Jan. 1, 2004

(30) Foreign Application Priority Data

Jun. 28, 2002 (JP) ........................................ 2002-190763

(51) Int. Cl.$^7$ ............................................. H03K 19/00
(52) U.S. Cl. ............................ 326/93; 326/46; 327/141
(58) Field of Search ............................. 326/93, 94, 96; 327/141, 161

(56) References Cited

U.S. PATENT DOCUMENTS 5,528,187 A * 6/1996 Sato et al. .................. 327/292
5,831,459 A * 11/1998 McDonald .................. 327/141
6,037,801 A * 3/2000 Zhu .............................. 326/46

FOREIGN PATENT DOCUMENTS

JP  05308259 A * 11/1993 ............ H03K/5/13
JP  07-028553    1/1995

* cited by examiner

Primary Examiner—James H. Cho
(74) Attorney, Agent, or Firm—Rabin & Berdo, P.C.

(57) ABSTRACT

The present invention provides a clock signal feeding circuit that suppresses performance degradation under the worst operating conditions. A clock signal CLK is fed, via a delay buffer with a capacitor as a delay element, to a FF disposed in the upstream of a logic circuit block having the longest processing time, and a clock signal CLK is fed, via a delay buffer with a transistor as a delay element, to a FF disposed in the downstream of the logic circuit block having the longest processing time. If the processing time of the logic circuit block increases due to factors such as variations in operating environment, and thus outputting of data representing the operation result delays, the timing of the clock signals fed to the FFs also delays due to the same factors.

11 Claims, 4 Drawing Sheets

CLOCK SIGNAL FEEDING CIRCUIT

BACKGROUND OF THE INVENTION

1. Field of the Invention

The present invention relates to a clock signal feeding circuit that feeds clock signals to a synchronous semiconductor logic circuit.

2. Description of the Related Art

A logic circuit of a system large-scale integrated circuit (LSI), which is used in a central processing unit (CPU) or in a digital signal processor (DSP) and the like, is typically a synchronous circuit that controls operation of each logic circuit block synchronously with common clock signals. A synchronous circuit consists of a plurality of flip-flops (FFs) that synchronize the transmitting and receiving of data between logic circuit blocks with clock signals, and a clock signal feeding circuit that feeds clock signals to these FFs.

Figure 2A:
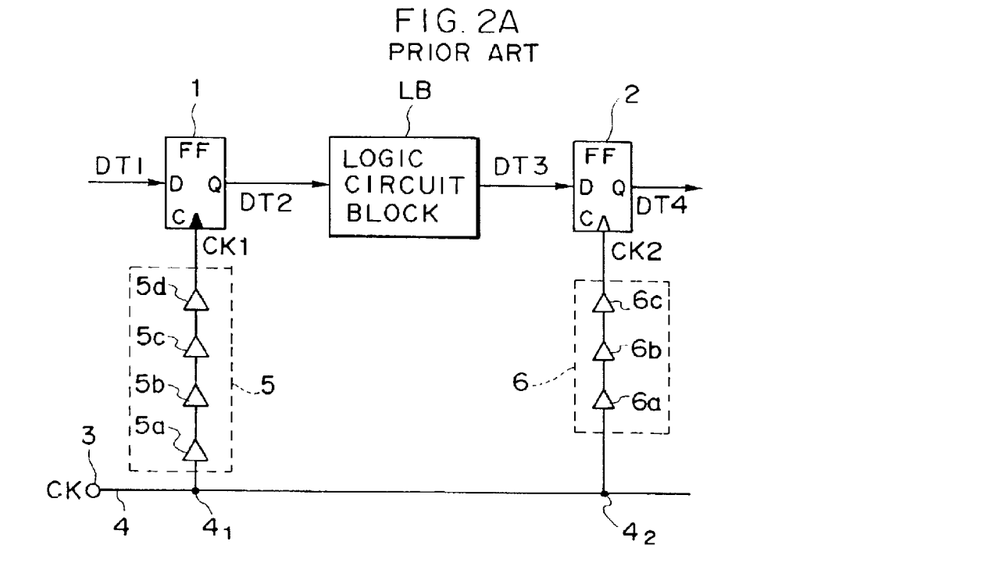
FIG. 2A is a structural diagram illustrating a portion of a clock signal feeding circuit in a conventional logic circuit.
Figure 2B:
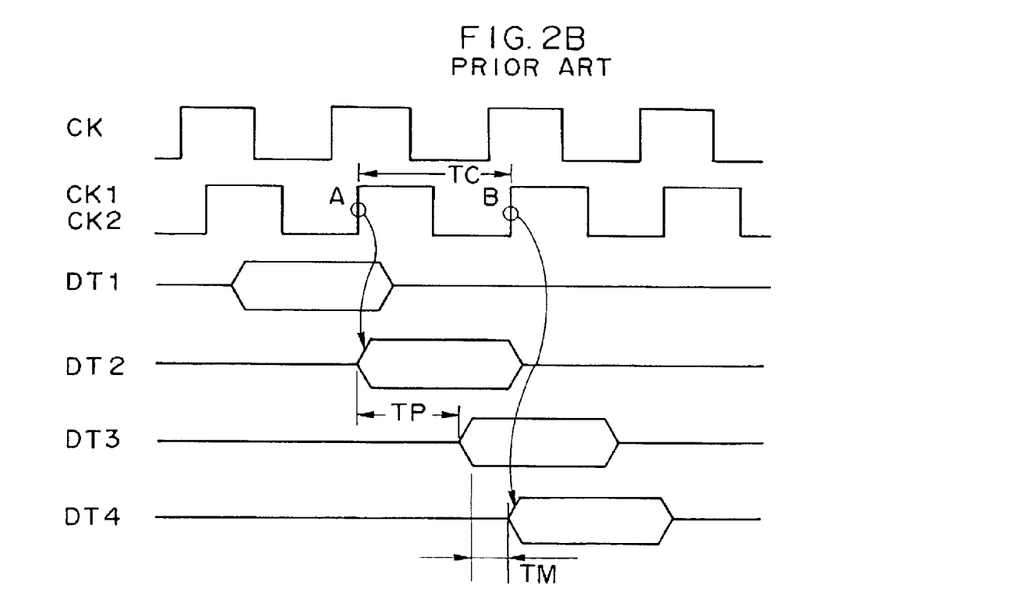
FIG. 2B is a signal timing chart of a clock signal feeding circuit in a conventional logic circuit.

FIG. 2A is a circuitry diagram and FIG. 2B is a signal timing chart. FIGS. 2A and 2B illustrate a portion of a clock signal feeding circuit in a conventional logic circuit.

As shown in FIG. 2A, the clock signal feeding circuit feeds clock signals CKs, which have been inputted into an input terminal 3, synchronously to a FF1 and a FF2 that are provided at input and output sides of a logic circuit block LB, respectively.

The clock signal feeding circuit comprises the input terminal 3, a clock signal line 4 connected to the input terminal 3, and delay buffers 5 and 6. The delay buffer 5 is provided on the clock signal line 4, downstream of a branch point $4_1$, and feeds clock signal CK1 to a clock terminal C of the FF1. The delay buffer 6 is provided on the clock signal line 4, downstream of a branch point $4_2$, and feeds clock signal CK2 to a clock terminal C of the FF2. The clock signal CK1 is fed to the FF1 provided close to the input terminal 3, via the branch point $4_1$ and delay buffer 5. The delay buffer 5 consists of four cascaded buffers 5a through 5d. The clock signal CK2 is fed to the FF2 provided away from the input terminal 3, via the branch point $4_2$ and delay buffer 6. The delay buffer 6 consists of three cascaded buffers 6a through 6c.

Each of the buffers 5a through 5d and 6a through 6c is formed from two serially-connected inverters, and is designed such that propagation delay time for each clock signal is constant. The number of the buffers inserted between the branch points $4_1$, $4_2$ of the clock signal line 4 and the clock terminal C of the FF1 and the FF2 is selected such that the clock signals CK1 and CK2 are synchronized at the clock terminal C of each FF1 and FF2.

The operation will be described below.

As FIG. 2B shows, the clock signal CK inputted at the input terminal 3 is fed to the clock terminal C of the FF1 as the clock signal CK1 via the clock signal line 4 and the delay buffer 5, after a predetermined delay time. Similarly, the clock signal CK is fed to the clock terminal C of the FF2 as the clock signal CK2 via the clock signal line 4 and the delay buffer 6, after a predetermined delay time. In this manner, the clock signals CK1 and CK2 are fed to the FF1 and FF2, respectively, in a substantially synchronized manner.

A data signal DT1, sent from a preceding logic circuit block (not shown) to a data terminal D of the FF1, is latched by the FF1 at a rise edge A of the clock signal CK1 and outputted from an output terminal Q as a data signal DT2. A data signal DT2, outputted from the FF1, is fed to the logic circuit block LB where predetermined logic operations are processed. After processing time TP has elapsed, a data signal DT3 representing the operation result is outputted and then inputted to the data terminal D of the FF2.

The data signal DT3, inputted into the FF2, is latched by the FF2 at a next rise edge B of the clock signal CK2 and outputted from an output terminal Q as a data signal DT4. The data signal DT4, outputted from the FF2, is fed to a subsequent logic circuit block (not shown).

The logic operation processing is conducted at each logic circuit block during each cycle of the clock signal CK, and the operation result is fed to the subsequent logic circuit block synchronously with the clock signal CK. Assuming that the cycle time of the clock signal CK is denoted by TC and the maximum processing time of the logic circuit block is denoted by TP, the margin of time TM of the operation in the logic circuit can be represented as TM=TC−TP.

Because the clock signal feeding circuit is structured such that the clock signals CK1, CK2 and the like are fed to the FF1, FF2 and the like synchronously, each logic circuit block can be designed simply and operation of the entire logic circuit becomes stable.

However, conventional clock signal feeding circuits have the following problems.

In each logic circuit block, data signals are inputted or outputted by clock signals that are fed synchronously in a constant cycle. Accordingly, each logic circuit block must be designed such that, even under the worst conditions within a guaranteed operating extent, the maximum processing time TP of the logic circuit block is shorter than the cycle time TC of the clock signal CK.

Reduction in operating speed of the logic circuit block is caused by variations in the operating environment, such as increases in the operating temperature, decreases in the power source voltage, and by the effect of variation in the manufacturing process. Variations in the operating environment contributing to the reduction in operating speed may include increases in gate oxide film thickness, increases in gate length, reduction in gate width, decrease in channel ion density, and the like. Logic circuits must meet the predetermined standards even if all of these operating speed reducing factors occur at the same time.

However, each of the logic circuit blocks, which altogether form the logic circuit, has a different function. The logic circuit has integrated therein both critical blocks requiring longer processing time for complex operations and simple circuits for simple operations. Therefore, the problem is that when specifications of the guaranteed operating extent are established based on the worst conditions in the critical blocks, even if the specifications in other logic circuit blocks become excessive, control of the maximum speed of the clock signal CK must be obtained.

SUMMARY OF THE INVENTION

The present invention is devised to solve the problems relating to the prior art and provide a clock signal feeding circuit that controls reduction in operating speed due to variation in conditions, and suppresses performance degradation under the worst operating conditions.

To solve the above problems, a first aspect of the present invention is a clock signal feeding circuit for feeding common clock signals to flip-flops that transmit and receive data between a plurality of logic circuit blocks, which form a semiconductor logic circuit, the clock signal feeding circuit comprising: a first delay buffer for feeding the clock signals to a first flip-flop, which passes data to a critical block with the longest processing time among those of the plurality of logic circuit blocks, the clock signals fed using at least one delay element of which variation in delay time resulting from variations in an operating environment or a manufacturing process is less than that of a critical block; and a second delay buffer for feeding the clock signals to a second flip-flop, which receives data from the critical block, the clock signals fed using delay elements of which variation in delay time resulting from an operating environment or a manufacturing process is substantially equal to variation in delay time of the critical block.

In a second aspect of the present invention, the first delay buffer in the first aspect includes a delay element that possesses a capacitor.

In a third aspect of the present invention, the second delay buffer in the first aspect is formed from a delay element that possesses a transistor of which gate length is substantially equal to that of the transistor in the critical block, and the first delay buffer is formed from a delay element that possesses a transistor of which gate length is longer than that of the transistor in the second delay buffer.

In the fourth aspect of the present invention, a clock signal feeding circuit comprises: a first logic circuit block, which forms a semiconductor logic circuit; a second logic circuit block, which forms the semiconductor logic circuit altogether with the first logic circuit block and conducts processing in processing time shorter than that of the first logic circuit block; a first latch circuit, which outputs data to the first logic circuit block; a second latch circuit, which receives data outputted from the first logic circuit block and then outputs data to the second logic circuit block; a clock terminal provided at each of the first and second latch circuits; a clock signal line, which is connected to each of the clock terminals, and to which the clock signals are inputted; a first delay buffer, which is connected between the clock signal line and the first latch circuit, and is formed from a delay element of which variation in processing time that is affected by an operating environment or a manufacturing process is smaller than variation in processing time that is affected by an operating environment or a manufacturing process in the first logic circuit block; and a second delay buffer, which is connected between the clock signal line and the second latch circuit, and is formed from a delay element of which variation in processing time that is affected by an operating environment or a manufacturing process is at least substantially equal to variation in processing time that is affected by an operating environment or a manufacturing process in the first logic circuit block.

In a fifth aspect of the present invention, the first logic circuit block in the fourth aspect is a logic circuit block that requires the longest processing time among those of the plurality of logic circuit blocks, which form the semiconductor logic circuit.

In a sixth aspect of the present invention, the first delay buffer in the fourth aspect includes a delay element that possesses a capacitor.

In a seventh aspect of the present invention, the second delay buffer in the fourth aspect is formed from a delay element that possesses a transistor of which gate length is substantially equal to that of the transistor in the first logic circuit block, and the first delay buffer is formed from a delay element that possesses a transistor of which gate length is longer than that of the transistor in the first logic circuit block.

In an eighth aspect of the present invention, the gate length of the transistor which forms the second delay buffer in the seventh aspect is the smallest among those of the transistors in the semiconductor logic circuit; and the gate length of the delay element forming the first delay buffer is determined based on the rate of variation in the minimum dimension, the cycle time of the clock signal, and the time from which the clock signal is transmitted on the clock signal line (i.e., from the time point at which the clock signal is inputted into the clock signal line to the time point at which the clock signal is inputted into the clock terminal of the latch circuit).

Because the clock signal feeding circuit is thus constructed, the present invention has the following operation.

The clock signals are fed, via the first delay buffer of which variation in delay time is small, to the first FF, which passes data to the critical block that requires the longest processing time among those of the plurality of logic circuit blocks. Further, the clock signals are fed, via the second delay buffer of which variation in delay time is substantially equal to that of the critical block, to the second FF, which receives data from the critical block. With this structure, when the processing time in the critical block increases due to circumstances such as variations in the operating environment, the timing of outputting the data representing the operation result delays, and the timing of feeding the clock signals to the second FF also delays due to the same circumstances. Accordingly, even if circumstances such as variations in the operating environment occur, the second FF receives the operation result outputted from the critical block.

As described above, the first aspect of the present invention comprises the first delay buffer for feeding the clock signals to the first FF, which passes data to the critical block, the clock signals fed using the delay element of which variation in delay time is small, and the second delay buffer for feeding the clock signals to the second FF, which receives data from the critical block, the clock signals fed using the delay element of which variation in delay time is substantially equal to variation in delay time in the critical block. With this structure, when the processing time in the critical block increases due to circumstances such as variations in the operating environment, the timing of feeding the clock signals to the second FF also delays at the same time, the reduction in operating speed due to variation in conditions can be controlled, and performance degradation under the worst operating conditions can be suppressed.

According to the second aspect of the present invention, the first delay buffer in the first aspect includes a delay element that possesses a capacitor, whereby the circuit can be designed simply.

According to the third aspect of the present invention, the second delay buffer in the first aspect is configured from a transistor of which gate length is substantially equal to that of the transistor in the critical block, and the first delay buffer is formed from a transistor of which gate length is longer than that of the transistor in the second delay buffer. With this structure, the clock signal feeding circuit can be designed through processes such as simulation more easily than in the second aspect, which possesses a capacitor, and also offers good accuracy with current manufacturing technology.

The fourth aspect of the present invention includes: the first delay buffer, which is formed from a delay element of which variation in delay time is smaller than variation in delay time in the first logic circuit block and feeds the clock signals to the first latch circuit that output data to the first logic circuit block requiring longer processing time; and the second delay buffer, which is formed from a delay element of which variation in delay time is substantially equal to variation in delay time in the first logic circuit block and feeds the clock signals to the second latch circuit that receives input of the data outputted from the first logic circuit block. With this structure, when the processing time in the first logic circuit block increases due to circumstances such as variations in the operating environment, the clock signal fed to the second latch circuit also delays at the same time, hence the reduction in operating speed due to variation in conditions can be controlled, and performance degradation can be suppressed.

According to the fifth aspect of the present invention, the first logic circuit block in the fourth aspect is a logic circuit block that requires the longest processing time among those of the plurality of logic circuit blocks, which form the semiconductor logic circuit. Therefore, performance degradation in the critical block under the worst operating conditions can be suppressed.

According to the sixth aspect of the present invention, the first delay buffer in the first aspect is formed from the delay element that possesses a capacitor, whereby the circuit can be designed simply.

According to the seventh aspect of the present invention, the second delay buffer in the fourth aspect possesses the transistor of which gate length is substantially equal to that of the transistor in the first logic circuit block, and the first delay buffer possesses the transistor of which gate length is longer than that of the transistor in the first logic circuit block. With this structure, the clock signal feeding circuit with higher accuracy than in the sixth aspect in which a capacitor is used can be obtained with current manufacturing technology.

According to the eighth aspect of the present invention, the gate length of the transistor which forms the second delay buffer in the seventh aspect is the smallest among those of the transistors in the semiconductor logic circuit. Further, the gate length of the transistor which forms the first delay buffer is determined in accordance with variation in the minimum dimension, the cycle time of the clock signal, and the time during which the clock signal is transmitted on the clock signal line. With this structure, the clock signal feeding circuit can be easily designed through processes such as simulation, and good accuracy can be obtained with current manufacturing technology.

DESCRIPTION OF THE PREFERRED EMBODIMENTS

First Embodiment

Figure 1:
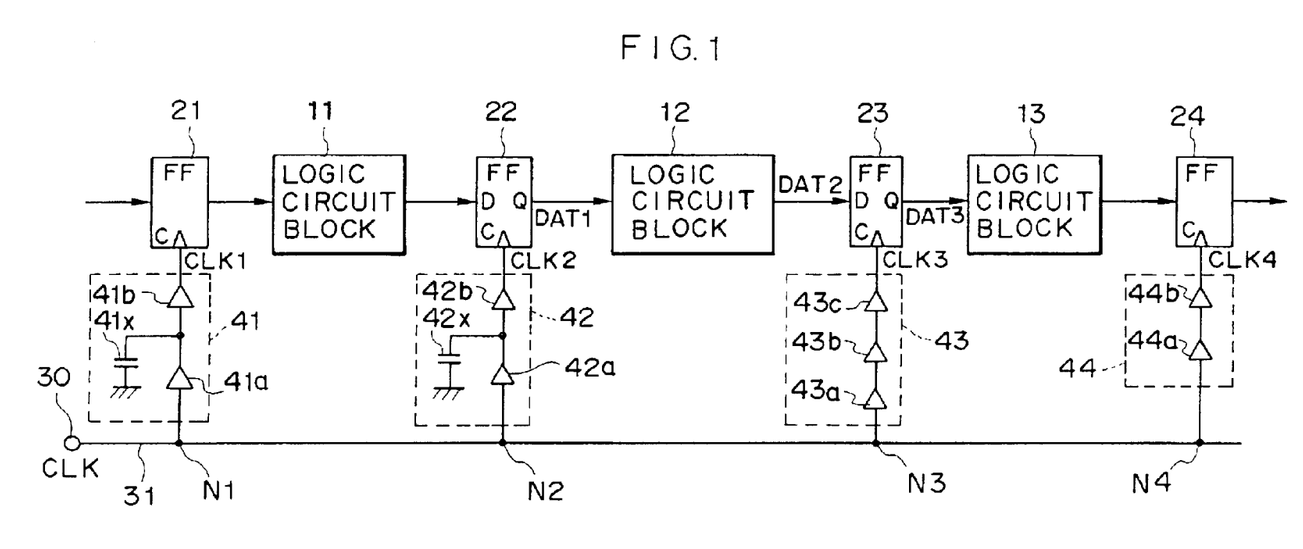
FIG. 1 is a structural diagram illustrating a clock signal feeding circuit relating to the first embodiment of the present invention.

FIG. 1 is a block diagram illustrating a clock signal feeding circuit of a first embodiment of the present invention.

The clock signal feeding circuit feeds clock signals CLK inputted at an input terminal 30 to FFs 21, 22, 23 and 24 that are provided upstream or downstream of logic circuit blocks 11, 12 and 13.

Among the logic circuit blocks 11 through 13, the logic circuit block 12 is a critical block that requires longer processing time for complex operation and serves as a critical path in the operation. The logic circuit blocks 11 and 13 are blocks of which processing time is shorter than that of the logic circuit block 12.

Each of the FFs 21 through 24 has a data terminal D, a clock terminal C and an output terminal Q. Each FF latches a signal at the data terminal D at a rise edge of a clock signal fed to the clock terminal C, and outputs the signal from the output terminal Q. The output side of the FF 21 is connected to the input side of the logic circuit block 11, and the output side of the logic circuit block 11 is connected to the input side of the FF 22. Similarly, the output side of the FF 22 is connected to the logic circuit block 12, and the output side of the logic circuit block 12 is connected to the input side of the FF 23. The output side of the FF 23 is connected to the logic circuit block 13, and the output side of the logic circuit block 13 is connected to the input side of the FF 24.

The clock signal feeding circuit consists of the input terminal 30, a clock signal line 31 connected to the input terminal 30, delay buffers 41, 42, 43 and 44. The delay buffers 41 through 44 feed clock signals CLK1, CLK2, CLK3 and CLK4, which are transmitted on the clock signal line 31 branched at branch points N1, N2, N3 and N4, respectively, to the clock terminal C of each FF 21, FF 22, FF 23 and FF 24.

The delay buffer 41 is disposed so as to connect the branch point N1 and the clock terminal C of the FF 21, and consists of buffers 41a, 41b and a capacitor 41x. The buffer 41a is connected to the branch point N1, and the capacitor 41x, serving as a delay element, is connected between the output side of the buffer 41a and ground potential GND. The output side of the buffer 41a is also connected to the clock terminal C of the FF 21 via the buffer 41b, which also functions as a waveform shaping element.

The delay buffer 42 is disposed so as to connect the branch point N2 and the clock terminal C of the FF 22, and consists of buffers 42a, 42b and a capacitor 42x serving as a delay element. The buffer 42a is connected to the branch point N2, and the capacitor 42x is connected between the output side of the buffer 42a and ground potential GND. The output side of the buffer 42a is connected to the clock terminal C of the FF 22 via the buffer 42b.

The delay buffer 43 is disposed so as to connect the branch point N3 and the clock terminal C of the FF 23, and consists of three cascaded buffers 43a, 43b and 43c.

The delay buffer 44 is disposed so as to connect the branch point N4 and the clock terminal C of the FF 24, and consists of two cascaded buffers 44a and 44b.

Each of the buffers 41a through 44d is formed from two serially-connected inverters, and is formed by the same process as that of the logic element forming the logic circuit block 12, and the like. The propagation time of each clock signal in the buffers 41a through 44b increases as temperature rises. For example, the propagation time in a buffer designed in 0.16 μm standard is 0.5 ns at room temperature (25° C.) and 0.7 ns at high temperature (125° C.).

The propagation time of the clock signal in each of the delay buffers 41 through 44 is adjusted by the number of the buffers, the capacity of the capacitor, and the like. The clock signals CLK1 through CLK4 fed to the FFs 21 through 24, respectively, are synchronized at normal temperature.

Figure 3A:
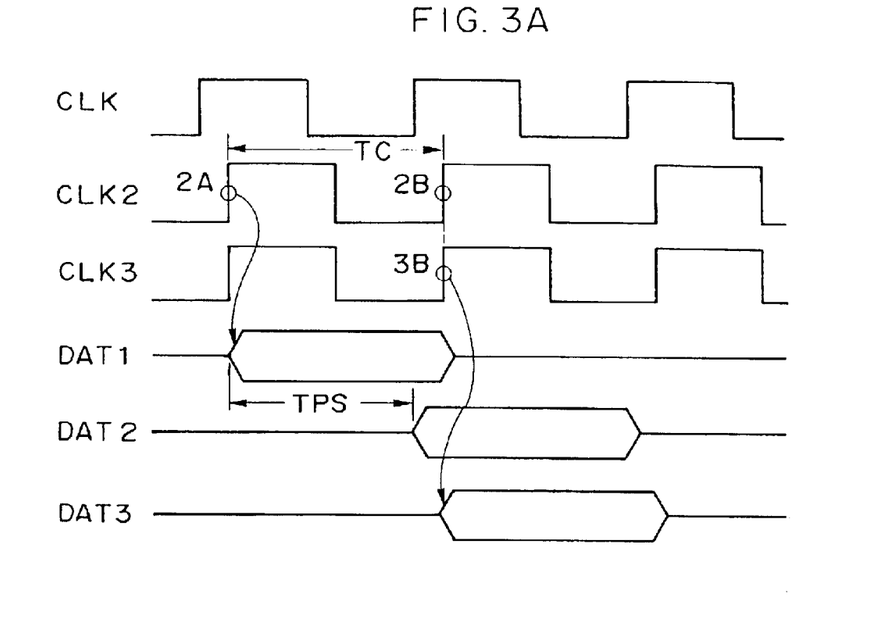
FIG. 3A is a signal timing chart illustrating an example of the operation under standard conditions in the circuit of FIG. 1.
Figure 3B:
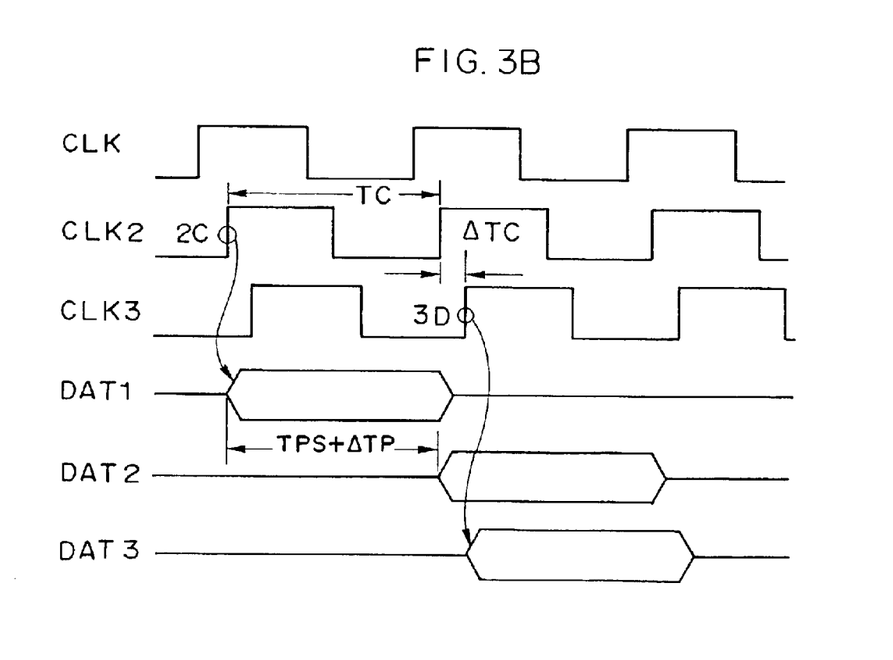
FIG. 3B is a signal timing chart illustrating an example of the operation under the worst conditions in the circuit of FIG. 1.

FIG. 3A is a signal timing chart illustrating an example of the operation under standard conditions in FIG. 1, and FIG. 3B is a signal timing chart illustrating an example of the operation under the worst conditions in FIG. 1. Referring to FIGS. 3A and 3B, operation around the logic circuit block 12, which is the critical block, in FIG. 1 will be described regarding (1) operation under standard conditions and (2) operation under the worst conditions.

(1) Operation Under Standard Conditions

Under standard conditions, in which operation is conducted at room temperature and a standard voltage is used as the power source voltage, the clock signals CLK1 through CLK4 that are fed, via the delay buffers 41 through 44, to the FF 21 through FF 24, respectively, are synchronized as shown in FIG. 3A.

The data signal inputted at the data terminal D of the FF 22 is latched by the FF 22 at a rise edge 2A of the clock signal CLK2 and outputted from the output terminal Q as a data signal DAT1. The data signal DAT1, outputted from the FF 22, is then inputted into the logic circuit block 12, where predetermined logic operation is processed. After processing time TP has elapsed, a data signal DAT2 representing the operation result is outputted and then inputted to the data terminal D of the FF 23.

The data signal DAT2 inputted into the FF 23 is latched by the FF 23 at the next rise edge 3B of the clock signal CLK3 and outputted from the output terminal Q as the data signal DAT3. The data signal DAT3, outputted from the FF 23, is then inputted into the subsequent logic circuit block 13.

Under standard conditions, because the clock signals CLK2 and CLK3 are synchronized, the rise edge 2B of the clock signal CLK2 and the rise edge 3B of the clock signal CLK3 are of the same timing. Accordingly, if the processing time TPS of the logic circuit block 12 is shorter than the cycle TC of the clock signal CLK, the data signal DAT2 can be latched by the FF 23 by the clock signal CLK3.

(2) Operation Under the Worst Conditions

If the operation is conducted under the worst conditions, such as at high temperature of 125° C. and the power source voltage is the lowest voltage within a guaranteed operating extent, processing time in each of the logic circuit blocks 11 through 13 increases with respect to that in the standard conditions.

The processing time increases due to temperature rise and to lowered power source voltage. The temperature rise is caused by, for example, increase in resistance resulting from lowered electron mobility in the wire, increase in channel resistance resulting from lowered charge transfer in the transistor channel, and lowered driving capability of the buffer. The lowered power source voltage is caused by factors such as lowered driving capability resulting from lowered drain-source voltage (Vds) of the transistor, or increases in the time during which the gate voltage exceeds a threshold voltage resulting from an increase in the ratio of a threshold voltage Vth with respect to the Vds.

These factors increase the processing time of the logic circuit block 12, which is the critical path under the worst conditions, by $\Delta TP$ and, as a result, the processing time of the logic circuit block 12 will be TPS+$\Delta TP$ as shown in FIG. 3B.

Because the buffers 41a through 44b in the delay buffers 41 through 44 are produced in the same process as that of the logic circuit block 12, the buffers 41a through 44b are also affected by the above factors. Under the worst conditions, the propagation time of the clock signals through the buffers 41a through 44b increases as the processing time of the logic circuit block 12 does.

The delay buffers 43 and 44, composed of the transistor buffers only, are susceptible to time delay peculiar to transistors. In contrast, the delay buffers 41 and 42, using capacitors as the delay elements in addition to the buffers, are less susceptible to increase in time delay peculiar to transistors.

With this structure, the increment in delay time of the clock signals under the worst conditions is small in the delay buffers 41 and 42, and becomes large in the delay buffers 43 and 44. As shown in FIG. 3B, the clock signal CLK3 delays by $\Delta TC$ with respect to the clock signal CLK2.

As shown in FIG. 3B, the data signal inputted at the data terminal D of the FF 22 is latched by the FF 22 at a rise edge 2C of the clock signal CLK2 and outputted from an output terminal Q as the data signal DAT1. The data signal DAT1, outputted from the FF 22, is then inputted into the logic circuit block 12, where predetermined logic operation is processed. After a processing time TPS+$\Delta TP$ has elapsed, a data signal DAT2 representing the operation result is outputted and then inputted to the data terminal D of the FF 23.

The data signal DAT2 inputted into the FF 23 is latched by the FF 23 at the next rise edge 3D of the clock signal CLK3 and outputted from an output terminal Q as the data signal DAT3. The data signal DAT3, outputted from the FF 23, is then inputted into the subsequent logic circuit block 13.

Under the worst conditions, because the clock signal CLK3 delays by $\Delta TC$ with respect to the clock signal CLK2, the time from the rise edge 2C of the clock signal CLK2 to the rise edge 3D of the clock signal CLK3 increases by $\Delta TC$ with respect to the cycle TC of the clock signal CLK. Accordingly, even if the processing time of the logic circuit block 12 increases by $\Delta TP$, the data signal DAT2 can be latched by the FF 23 at the rise edge 3D of the clock signal CLK3 when TPS+$\Delta TP$<TC+$\Delta TC$.

As described above, the clock signal feeding circuit of the first embodiment includes: the delay buffer 42, which feeds, via the capacitor therein adjusting the delay time, the clock signal CLK2 to the FF 22 that feeds the data signal DAT1 to the logic circuit block 12 serving as the critical path; and the delay buffer 43, which feeds, via the transistor therein that is formed by the same process as that of the logic circuit block 12 and adjusts the delay time, the clock signal CLK3 to the FF 23 that latches the data signal DAT2 outputted from the logic circuit block 12.

With this structure, even if the processing time of the logic circuit block 12 increases due to factors such as temperature rise and lowered power source voltage, reduction in operating speed due to variation in conditions can be controlled because the clock signal CLK3 for latching the operation result of the logic circuit block 12 also delays. Thus, performance degradation under the worst operating conditions can be suppressed.

Second Embodiment

Figure 4:
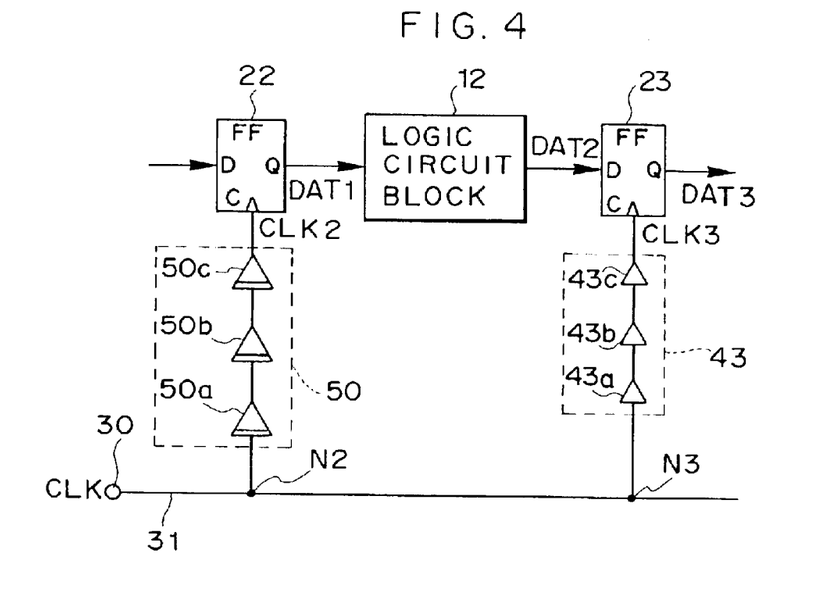
FIG. 4 is a structural diagram illustrating a clock signal feeding circuit relating to the second embodiment of the present invention.

FIG. 4 is a block diagram illustrating a clock signal feeding circuit of a second embodiment of the present invention. Components similar to those in FIG. 1 are denoted by the similar reference numerals. FIG. 4 shows only a portion of the clock signal feeding circuit near the logic circuit block 12 serving as the critical path, and the FF 22 and FF 23, disposed upstream and downstream of the logic circuit block 12.

A delay buffer 43, consisting of three buffers 43a through 43c formed from transistors having gate length of 0.16 μm, is connected to the branch point N3 of the clock signal line 31. The output side of the delay buffer 43 is connected to the clock terminal C of the FF 23 as in the case in FIG. 1.

A delay buffer 50, consisting of three cascaded buffers 50a through 50c formed from transistors having long gate length (e.g., 0.8 μm or more), is connected to the branch point N2 of the clock signal line 31. The output side of the delay buffer 50 is connected to the clock terminal C of the FF 22.

The propagation time of the clock signal in each of the delay buffers 43 and 50 is adjusted by the number of the buffers they are made up of. The clock signals CLK2 and CLK3 fed to the FFs 22 and 23, respectively, are synchronized at normal temperature.

Variation in manufacturing process of the thus designed clock signal feeding circuit will be described below.

Variation in manufacturing process, which may result in reduction in operating speed, is caused by, for example, increase in threshold voltage due to thickened gate oxide film of the transistor, increase in channel resistance resulting from increased gate length due to thick gate film, or increase in channel resistance resulting from reduced career in the channel. Among these, regarding the thickness of the gate film (i.e., the gate length), the longer the object gate length is set, the smaller the error rate resulting from process variation becomes.

Accordingly, if the gate film becomes thick due to variation in manufacturing process, the processing time of the logic circuit block 12 increases by $\Delta TP$ with respect to the processing time TPS under standard conditions. At the same time, the delay time of the clock signals in the delay buffer 43 is also increased by $\Delta TC$. The delay buffer 50, however, is formed from the buffers 50a through 50c having longer gate length, and is thus less susceptible to increase in delay time due to variation in manufacturing process.

Accordingly, even if the processing time of the logic circuit block 12 increases by $\Delta TP$ due to variation in manufacturing process, the data signal DAT2 can be latched by the FF 23 by the clock signal CLK3 when $TPS+\Delta TP<TC+\Delta TC$.

Next, procedure in searching for the gate length of the transistor which forms the delay buffer 50 of the present invention will be described with reference to examples.

For example, in a semiconductor logic circuit that includes the clock signal feeding circuit, assuming that the minimum gate length of the transistor forming the circuit is 0.16 μm, it is designed so that the cycle of the clock signal CLK inputted at the input terminal 30 is 10 ns, the time in which the clock signal CLK inputted at the input terminal 30 reaches the clock terminal C of the FF 22 and 23 is 3 ns, rate of variation (fluctuation) in dimension in the minimum gate length is 10%, and that the logic block 12 and the delay buffer 43 are formed from the transistor of the minimum gate length; the time in which the clock signal CLK is transmitted from the input terminal 30 to the clock terminal C of the FF 22 via the delay buffer 50 consisting of a transistor having long gate length, and the time in which the clock signal CLK is transmitted from the input terminal 30 to the clock terminal C of the FF 23 are designed to be 3 ns under standard conditions.

The processing time TPS in the logic circuit block 12 is designed to be or less than 10 ns, under the worst conditions (e.g., when the minimum gate length increases by 10%), and therefore the processing time TPS should be designed to be about 9.09 ns in the standard conditions, considering the increment of 10% in the gate length.

Under the worst conditions, the gate length of the transistor forming the logic block 12 and the delay buffer 43 increases by 10%, i.e., about 0.016 μm, with respect to the minimum gate length. That is, in the logic block 12 and the delay buffer 43 formed from the transistor having the minimum gate length, the gate length is 0.176 μm, which is 10% longer than the gate length in the standard conditions. However, in the delay buffer 50 formed from a transistor having the gate length about five times (i.e., by 0.8 μm) longer than the minimum gate length, the gate length is 0.816 μm, which is only 2% longer than the gate length in the standard conditions.

As a result, the processing time both in the logic block 12 and in the delay buffer 43 formed from a transistor having the minimum gate length increases by 10% with respect to the processing time in the standard conditions. The processing time TPS in the logic circuit block 12 will be about 10 ns, and the delay time from the input terminal 30 to the clock terminal C of the FF 23 will be about 3.3 ns. However, in the delay buffer 50 formed from a transistor having long gate length, the delay time increases by about 2% with respect to the delay time in the standard conditions, and the delay time from the input terminal 30 to the clock terminal C of the FF 22 will be about 3.06 ns.

In other words, the clock signal feeding circuit in the present embodiment can be designed so that the logic circuit block 12 conducts processing under the worst conditions, within the time (10.24 ns), which is obtained by adding to the cycle 10 ns of the clock signal CLK the difference (0.24 ns) between the delay time (3.3 ns) from the input terminal 30 to the clock terminal C of the FF 23, and the delay time (3.06 ns) from the input terminal 30 to the clock terminal C of the FF 22. Accordingly, it can be designed so that the processing time TPS of the logic circuit block 12 under the standard conditions is set to be about 9.31 ns.

By applying the clock signal feeding circuit in the above-described conditions, the logic circuit block 12 can be designed such that the processing time TPS thereof increases by about 0.22 ns, whereby the time for designing the logic circuit block 12 can be reduced.

Further, regarding electric current in a saturation region in Id (drain current)-Vd (drain voltage) characteristic of the transistor, the electric current in a saturation region of a transistor having longer gate length tends to be more constant than that of a transistor having shorter gate length. Thus, a transistor having longer gate length is less affected by decreases in power source voltage.

As described above, the clock signal feeding circuit of the second embodiment includes: the delay buffer 50, which feeds, via the transistor therein that has long gate length and adjusts the delay time, the clock signal CLK2 to the FF 22 that feeds the data signal DAT1 to the logic circuit block 12 serving as the critical path; and the delay buffer 43, which feeds, via the transistor therein that has the same gate length as that of the logic circuit block 12 and adjusts the delay time, the clock signal CLK3 to the FF 23 that latches the data signal DAT2 outputted from the logic circuit block 12.

With this structure, even if the processing time of the logic circuit block 12 increases due to circumstances such as variation in manufacturing process and lowered power source voltage, because the clock signal CLK3 for latching the operation result of the logic circuit block 12 also delays, which generates the same advantages as those of the first embodiment.

Further, the clock signal feeding circuit can be designed through processes such as simulation more easily when the delay time is adjusted by extending the gate length with respect to the case in which the delay time is adjusted by a capacitor, and good accuracy can be obtained with current manufacturing technology.

The present invention is not limited to the embodiments specified herein and can be modified in various manners. For example, modification of the present invention may include the following:

(a) the number of the buffers in each of the delay buffers 41 through 44 and 50 must be selected in accordance with wiring conditions of the clock signal line 31, positions of the FF 21 through 24, delay time of the buffers, and the like;

(b) although the clock signal feeding circuit in FIG. 1 feeds the clock signal CLK to four FFs 21 through 24 that transmit and receive data between three logic circuit blocks 11 through 13, the number of the logic circuit blocks is not limited thereto.

It can be designed so that the clock signal CLK is fed, via a delay buffer with smaller variation in delay time, to the FF upstream of the critical block, and the clock signal CLK is fed, via a delay buffer with larger variation in delay time, to the FF downstream of the critical block.

What is claimed is:

1. A clock signal feeding circuit for feeding common clock signals to flip-flops that transmit and receive data between a plurality of logic circuit blocks, which form a semiconductor logic circuit, the clock signal feeding circuit comprising:

a first delay buffer for feeding the clock signals to a first flip-flop, which passes data to a critical block with the longest processing time among those of the plurality of logic circuit blocks, said clock signals fed using at least one delay element of which variation in delay time resulting from variations in an operating environment or a manufacturing process is less than that of a critical block; and a second delay buffer for feeding the clock signals to a second flip-flop, which receives data from the critical block, said clock signals fed using delay elements of which variation in delay time resulting from an operating environment or a manufacturing process is substantially equal to variation in delay time of the critical block.

2. The clock signal feeding circuit of claim 1, wherein said first delay buffer includes a delay element that possesses a capacitor.

3. The clock signal feeding circuit of claim 1, wherein:

said second delay buffer includes a delay element that possesses a transistor of which gate length is substantially equal to that of the transistor in said critical block; and said first delay buffer includes a delay element that possesses a transistor of which gate length is longer than that of the transistor in said second delay buffer.

4. A clock signal feeding circuit, comprising:

a first logic circuit block, which forms a semiconductor logic circuit;

a second logic circuit block, which forms said semiconductor logic circuit altogether with said first logic circuit block and conducts processing in processing time shorter than that of said first logic circuit block;

a first latch circuit, which outputs data to said first logic circuit block;

a second latch circuit, which receives data outputted from said first logic circuit block and then outputs data to said second logic circuit block;

a clock terminal provided at each of said first and second latch circuits;

a clock signal line, which is connected to each of the clock terminals, and to which said clock signals are inputted;

a first delay buffer, which is connected between said clock signal line and said first latch circuit, and is formed from a delay element of which variation in processing time that is affected by an operating environment or a manufacturing process is smaller than variation in processing time that is affected by an operating environment or a manufacturing process in said first logic circuit block; and a second delay buffer, which is connected between said clock signal line and said second latch circuit, and is formed from a delay element of which variation in processing time that is affected by an operating environment or a manufacturing process is at least substantially equal to variation in processing time that is affected by an operating environment or a manufacturing process in said first logic circuit block.

5. The clock signal feeding circuit of claim 4, wherein said first logic circuit block is a logic circuit block that requires the longest processing time among those of said plurality of logic circuit blocks, which form said semiconductor logic circuit.

6. The clock signal feeding circuit of claim 4, wherein said first delay buffer includes a delay element that possesses a capacitor.

7. The clock signal feeding circuit of claim 4, wherein:

said second delay buffer includes a delay element that possesses a transistor of which gate length is substantially equal to that of the transistor in said first logic circuit block; and said first delay buffer includes a delay element that possesses a transistor of which gate length is longer than that of the transistor in said first logic circuit block.

8. The clock signal feeding circuit of claim 7, wherein:

the gate length of the transistor that forms said second delay buffer is the smallest among those of the transistors forming said semiconductor logic circuit; and the gate length of the delay element, which is included in said first delay buffer, wherein said gate length is determined based on variations in said minimum dimension, the cycle time of said clock signal, and the time period from which said clock signal is inputted into said clock signal line until said clock signal is inputted into said clock terminal of said latch circuit.

9. A clock signal feeding circuit, comprising:

a clock signal input terminal into which a TC cycle clock signal is inputted;

a first latch circuit having a clock terminal into which a clock signal for controlling timing of outputting data is inputted;

a semiconductor logic circuit block, which inputs data from said first latch circuit and processes the data in processing time TPS;

a second latch circuit, which inputs data from said semiconductor logic circuit block and has a clock terminal into which a clock signal for controlling timing of outputting data is inputted;

a first delay buffer, which is provided between said first latch circuit and said clock signal input terminal, said first delay buffer delaying the clock signal so that the clock signal inputted at said clock signal input terminal is synchronously inputted to the clock terminal of said first latch circuit and to the clock terminal of said second latch circuit; and a second delay buffer, of which variation in delay time resulting from variations in an operating environment or in a manufacturing process is by ΔTC longer than such variations in said first delay buffer, the second delay buffer being provided between said second latch circuit and said clock signal input terminal, and delaying the clock signal so that the clock signal inputted at said clock signal input terminal is simultaneously inputted to the clock terminal of said first latch circuit and to the clock terminal of said second latch circuit, wherein, when the variation in delay time resulting from variations in an operating environment or a manufacturing process is denoted by ΔTP, wherein TPS+ΔTP<TC+ΔTC.

10. The clock signal feeding circuit of claim 9, wherein said first delay buffer includes a capacitor and a transistor, wherein said transistor is manufactured by the same process as that of said semiconductor logic circuit; and said second delay buffer includes only a transistor that is manufactured by the same process as that of said semiconductor logic circuit.

11. The clock signal feeding circuit of claim 9, wherein said first delay buffer includes a transistor of which gate length is longer than that of the transistor included in said semiconductor logic circuit; and said second delay buffer includes a transistor of which gate length is substantially equal to that of the transistor in said semiconductor logic circuit block.

* * * * *